US008926353B2

(12) United States Patent
Chen

(10) Patent No.: US 8,926,353 B2
(45) Date of Patent: Jan. 6, 2015

(54) BURN-IN SOCKET WITH IMPROVED TERMINALS

(71) Applicant: Hon Hai Precision Industry Co., Ltd., New Taipei (TW)

(72) Inventor: Ming-Yue Chen, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 21 days.

(21) Appl. No.: 13/902,984

(22) Filed: May 28, 2013

(65) Prior Publication Data

US 2013/0344711 A1 Dec. 26, 2013

(30) Foreign Application Priority Data

Jun. 25, 2012 (TW) .............................. 101212138 U

(51) Int. Cl.
*H01R 11/22* (2006.01)
*H01R 13/426* (2006.01)
*G01R 1/04* (2006.01)
*H01R 13/11* (2006.01)

(52) U.S. Cl.
CPC ............ *H01R 13/426* (2013.01); *G01R 1/0458* (2013.01); *G01R 1/0466* (2013.01); *H01R 13/112* (2013.01)
USPC ....................................... 439/268

(58) Field of Classification Search
USPC .......................................... 439/360, 368, 364
See application file for complete search history.

(56) References Cited

U.S. PATENT DOCUMENTS

| 6,126,467 | A * | 10/2000 | Ohashi ........................... 439/268 |
| 6,609,923 | B2 * | 8/2003 | Sato et al. ...................... 439/259 |
| 7,134,892 | B2 * | 11/2006 | Hayakawa ..................... 439/268 |
| 7,601,018 | B2 * | 10/2009 | Hwang .......................... 439/331 |

* cited by examiner

*Primary Examiner* — Phuong Dinh
(74) *Attorney, Agent, or Firm* — Wei Te Chung; Ming Chieh Chang

(57) ABSTRACT

A burn-in socket includes an insulative seat with a plurality of terminal-retained passageways, a sliding member defining a plurality of terminal-receiving passageways, a driven frame and a plurality of terminal retained in terminal-retained passageways of the seat and received in the terminal-receiving passageways of the sliding member. Each of the terminal-receiving passageways defines two opposite inner sides. Each terminal includes a base portion, a board-connecting portion and a pair of clamping arm consisting of a movable arm and a static arm, the pair of clamping arms defining clamping end at tips thereof. The pair of clamping arms are located elastically against corresponding inner sides, the static arm defines a lower curved portion with a projecting end and an upper linear portion, the projecting end of the lower curved portion of the static arm elastically presses against the movable arm permanently.

11 Claims, 10 Drawing Sheets

BURN-IN SOCKET WITH IMPROVED TERMINALS

BACKGROUND OF THE INVENTION

1. Field of the Invention

The present invention relates to a burn-in socket for testing an IC package, and particularly to a burn-in socket having improved terminals to simply and improve an insulative seat of the burn-in socket.

2. Description of Related Art

Burn-in socket is an indispensable equipment for ensuring the proper normal function of an integrated circuits (IC) package before it is delivered. Conventional burn-in sockets typically include a base with a plurality of terminals, a driven frame mounted upon the base and movable in a top-to-bottom direction, and a sliding board assembled on the base and driven by the frame to slide in a longitudinal direction. The terminal usually has a pair of clamping arms including a movable arm and a static arm, the movement of the sliding board can bring the clamping arms to open.

The base defines terminal-receiving passageways to accommodate the pairs of clamping arms. Generally each of the terminal-receiving passageways includes two holes to receive clamping arms respectively since the clamping arms are long, thereby avoiding swaying of the two clamping arms. On the other hand, each terminal-receiving passageway is weaker in base's strength.

Hence, an improved socket is required to overcome the above-mentioned disadvantages of the related art.

SUMMARY OF THE INVENTION

An object of the present invention is to provide a burn-in socket with improved terminals.

To achieve the aforementioned object, a burn-in socket comprises an insulative seat with a plurality of terminal-retained passageways, a sliding member receiving in insulative housing and defining a plurality of terminal-receiving passageways, a driven frame located on the sliding member and driving the sliding member moving relative to the insulative seat and a plurality of terminal retained in terminal-retained passageways of the insulative seat and received in the terminal-receiving passageways of the sliding member. Each of the terminal-receiving passageways defines two opposite inner sides. Each terminal comprises a base portion retained in the insulative seat, a board connecting portion and a pair of clamping arm consisting of a movable arm and a static arm, the pair of clamping arms defining clamping ends at tips thereof. The pair of clamping arms are located elastically against corresponding inner sides, the static arm defines a lower curved portion with a projecting tip and an upper linear portion, the projecting tip of the lower curved portion of the static arm elastically presses against the movable arm permanently.

Other objects, advantages and novel features of the invention will become more apparent from the following detailed description of a preferred embodiment when taken in conjunction with the accompanying drawings.

DETAILED DESCRIPTION OF THE INVENTION

Figure 1:
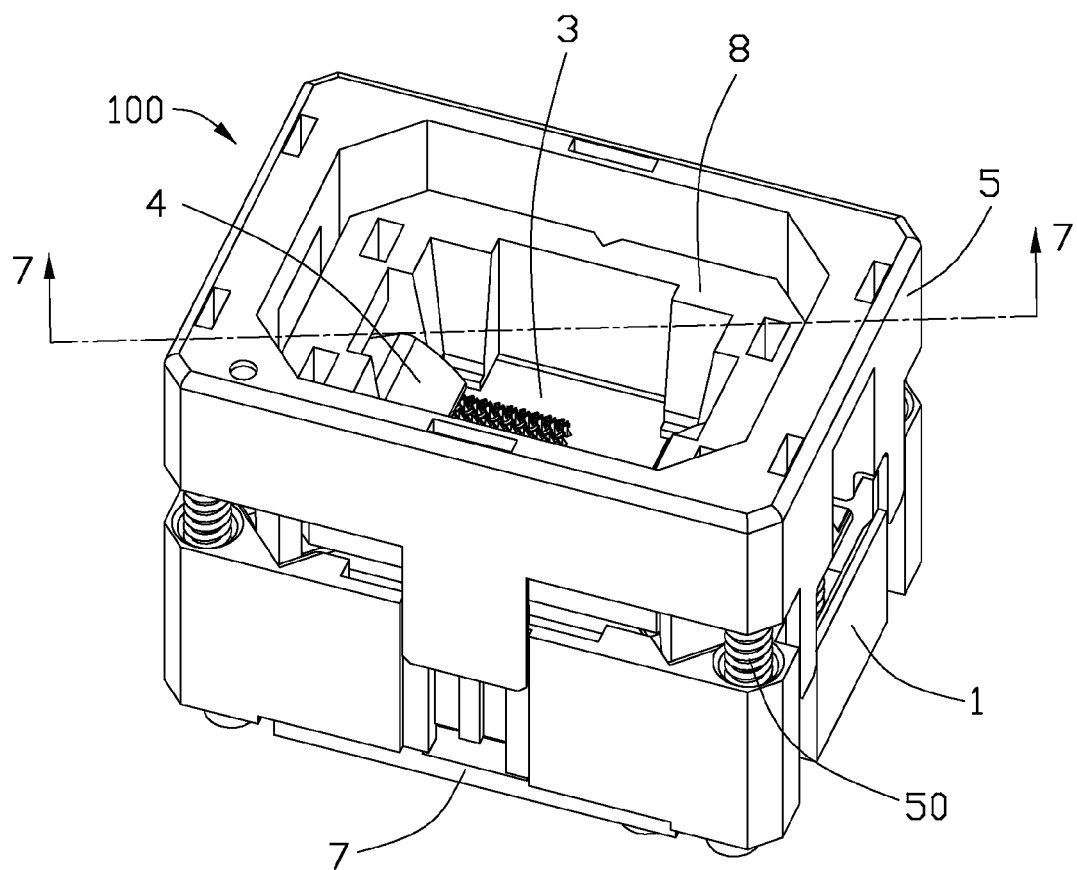
FIG. 1 is a perspective view of a burn-in socket in accordance with a preferred embodiment of present invention.
Figure 2:
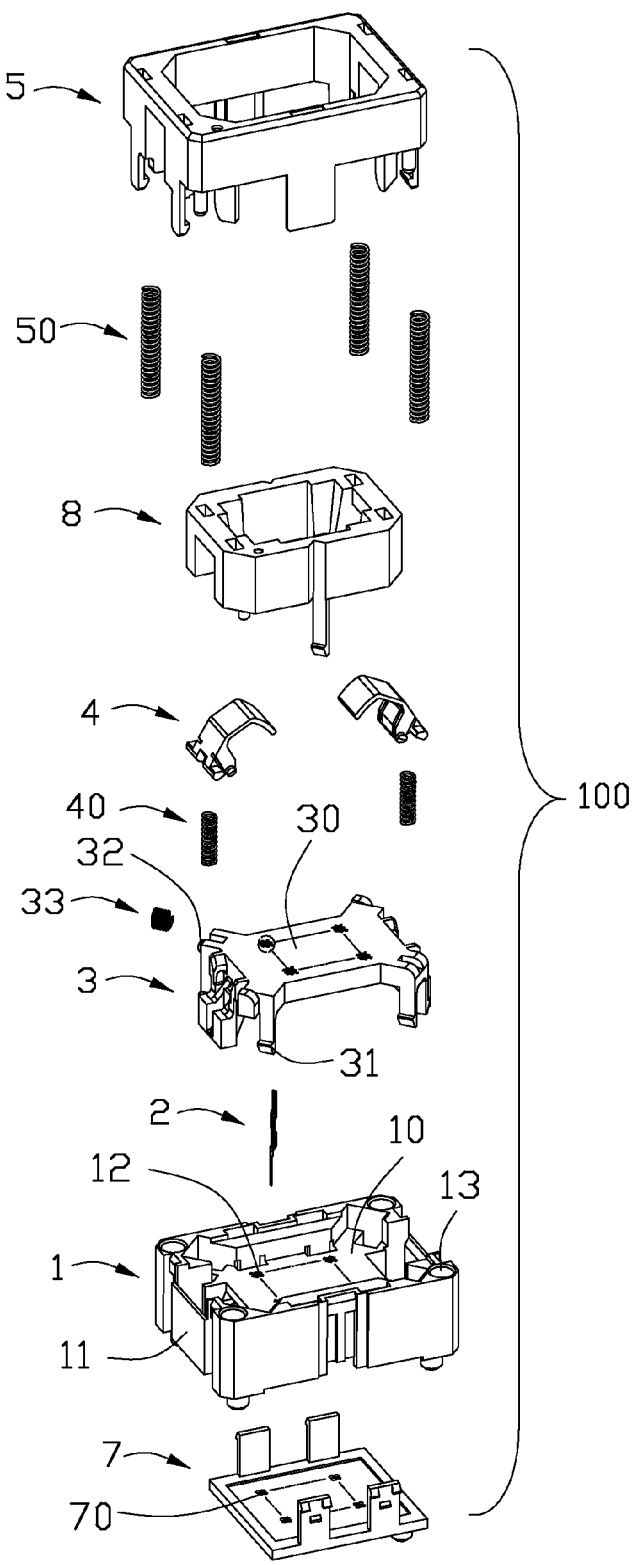
FIG. 2 is an exploded, perspective view of the burn-in socket.

Referring to FIGS. 1 and 2, a burn-in socket 100 in accordance with the preferred embodiment of the present invention is used to electrically connect an IC package (not shown) and comprises an insulative seat 1, a plurality of terminals 2 in the seat, a sliding member 3, a pair of pressing members 4, a driven frame 5 and a protecting board 7.

The insulative seat 1 has a rectangular configuration, and defines a receiving cavity 10 among four sidewalls 11 connecting with each other in turn and a plurality of terminal-retained passageways 12 in a center of the bottom of the receiving cavity 10 and four receiving holes 13 on four corners thereof for receiving coil springs 50 to support the driven frame 5. Please notes, the terminals 2 are received in the terminal-retained passageways 12 and fitly retained in the insulating seat 1. Each passageway 12 is retained with only one terminal 2.

Figure 3:
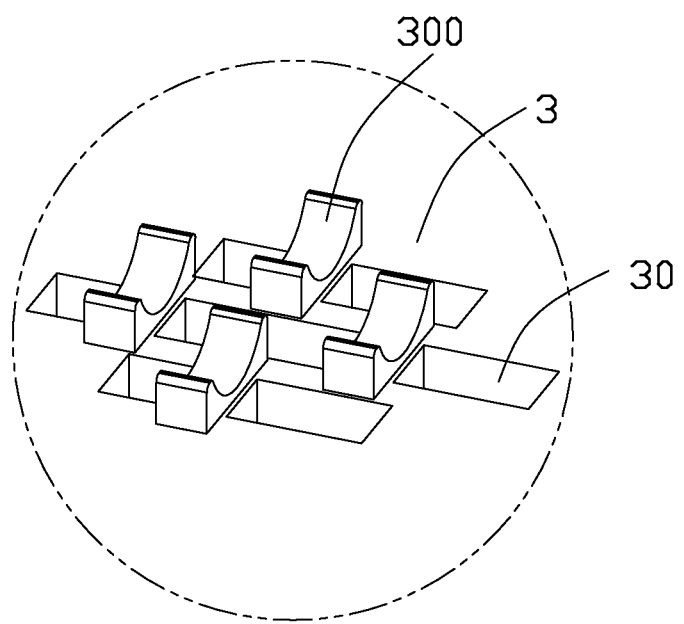
FIG. 3 is an enlarged perspective view of a part of a sliding member of the burn-in socket.

The sliding member 3 is assembled in the insulative seat 1, and defines an array of terminal-receiving passageways 30 for receiving the terminals 2, the terminal receiving passageways 30 are aligned with the corresponding terminal-retained passageways 12 in the seat one by one. The sliding member 3 is provided with a biasing post 32 at one corner thereof for positioning a coil spring 33. The sliding member 3 has a plurality of locking legs 31 protruding from two sides of two longitudinal ends thereof, each locking portion 31 has an arch surface. The sliding member 3 is limited in receiving cavity 10 of the seat by the locking legs 31 in a vertical direction. The biasing post 32 with the spring 33 extends horizontally in a diagonal line, so that the sliding member 3 moves horizontally in a diagonal line by the driven frame 5 and returns back by restoring forces of the springs 33. As shown in FIG. 3, the array of the terminal-receiving passageways 30 of the sliding member 3 is arranged in a plurality of rows and columns. Each row of the passageways 30 is linear which are aligned with each other. In columns, two adjacent passageways 30 for example are offset from each other. A rib 300 projects upright between every two adjacent passageways in each row of the passageways. The rib 300 is oriented in the column direction is construed in a crescent-moon shape with two higher ends and a lower centre so as to nicely receive a corresponding soldering ball of the IC package. When the sliding member 3 is assembled in the receiving cavity of the seat 1, the plurality of the terminals 2 are ready to be inserted into the seat 1 and the sliding member 3 moves in a lower to upper direction.

Figure 4:
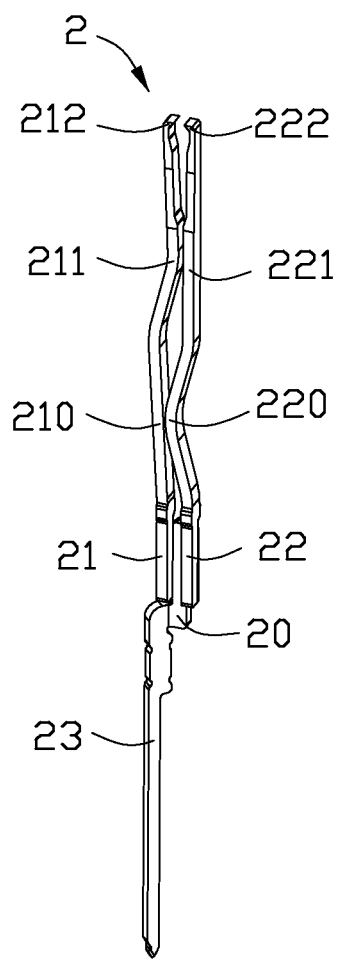
FIG. 4 is a perspective view of a terminal of the burn-in socket.
Figure 5:
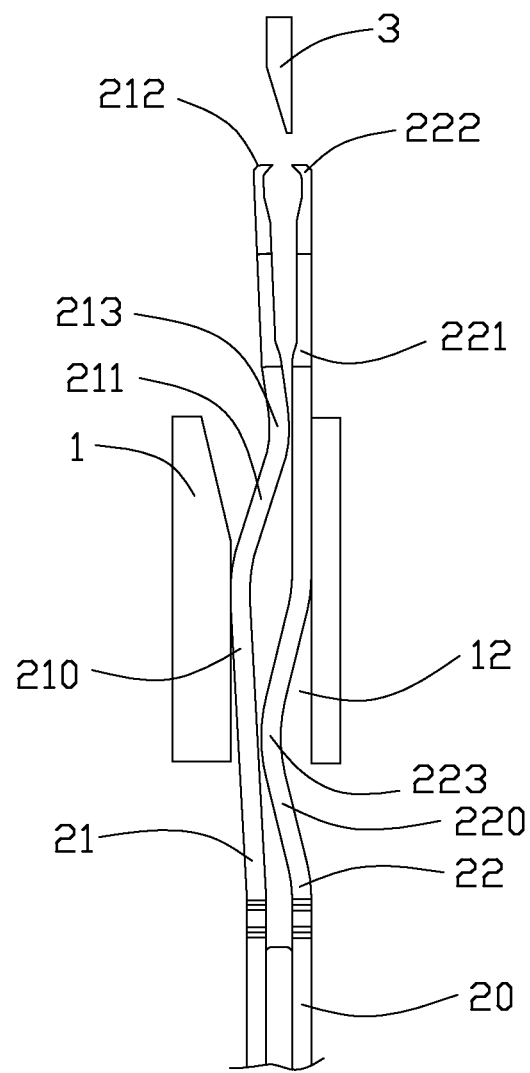
FIG. 5 is a sketch sectional view of the burn-in socket, showing the terminal is ready for being inserted with the sliding member.
Figure 6:
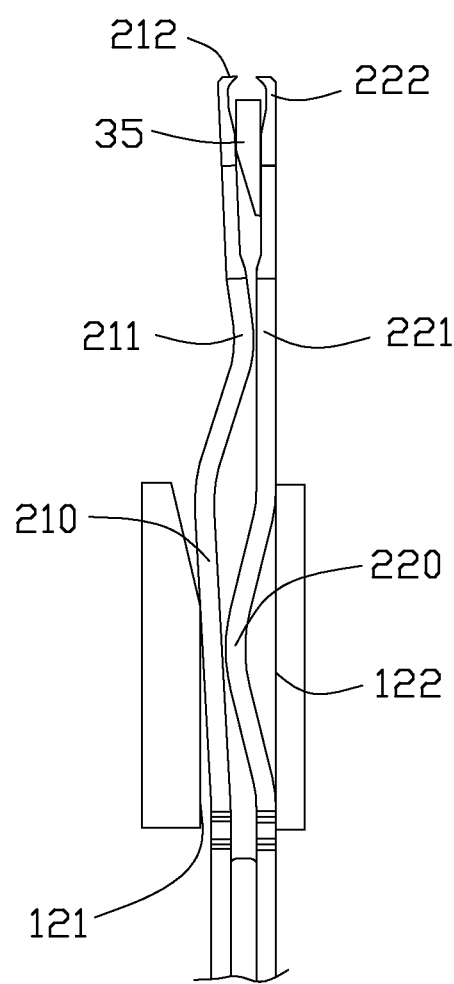
FIG. 6 is a sketch cross sectional view of the burn-in socket, showing the terminal is inserted in the sliding member

Referring to FIG. 4 through FIG. 6, each terminal 2 stamped from a metal strip, includes a main body 20 retained in the terminal-retained passageways 12 of the seat, a pair of clamping arms upwardly extending from the main body 20 and a soldering portion 23 downwardly extending from the main body 20 to connect with a printed circuit board. The pair of clamping arms includes a movable arm 21 with deflectable elasticity and a static arm 42 with deflectable elasticity, both of them defines clamping ends 212, 222 at tips thereof to clamp one soldering ball of the IC package. The movable arm 21 is construed with a lower linear portion 210 and an upper curved portion 211, the upper curved portion curves toward the static arm with a projecting tip 213 pressing against the static arm 22. The static arm 22 is construed with a lower curved portion and an upper liner portion 221, the lower curved portion curved toward the movable arm with a projecting tip 223. The projecting tip 223 presses against the lower linear portion 210 of the movable arm 21.

FIG. 5 to FIG. 6 show an assembly process of one terminal 3 into the seat 1 and the sliding member 3 after the sliding member 3 is retained in the seat 1. Each terminal-retained passageway 12 of the seat 1 has opposite inner sides or dividing wall 121, 122. The two clamping arms of the terminal 2 are firstly inserted into a same terminal-retained passageway 12. Please notes, the terminal-retained passageway 12 has no rib and partition wall therein, thereby the clamping arms 21, 22 upwardly moving successfully. When the terminal 2 moves up to a certain extent, the upper linear portion 221 of the static arm 22 and the lower linear portion 210 of the movably arm 21 is located against the inner sides 121, 122, and the projecting tip 213 of the upper curved portion 211 of the movable arm 21 presses against the upper linear portion 221 of the static arm 22. According to the lever principle of the movable arm 21, the clamping end 212 move far away from the clamping end 222, so that there is a largest gap between the two clamping ends which is ready for insertion of the terminal to the terminal-receiving passageway 30 of the sliding member 3. The two clamping arms are inserted into two adjacent terminal-receiving passageways 30 of the sliding member 3, the rib 300 is located between the movable arm 21 and the static arm 22. As best shown in FIG. 6, the inner sides 121, 122 are disposed against the lower linear portion 210 and the lower curved portion 220 and the lower curved portion is against the lower linear portion at least. Moreover, the lower end of the upper linear portion is against the inner side 122. Therefore, an inter-engagement of the movable arm 21 and static arm 22 in a long cantilever form is established to avoid swaying of the two clamping arms. The upper curved portion 211 is free from the upper linear portion 221. That means, each terminal-receiving passageway 30 is in a form two spaced holes with partitioning wall 35 therein.

Referring to FIGS. 1 and 2, the driven frame 5 is assembled to the seat 1 on the sliding member 3 which can be driven downwards to push the pair of pressing members 50 shift outwards and returns back by the springs 50. A positioning frame 8 is further provided between the driven frame 5 and the sliding member 3 to receive the IC package. A protecting board 7 is attached at a bottom of the seat with terminal passageways 70.

Figure 7:
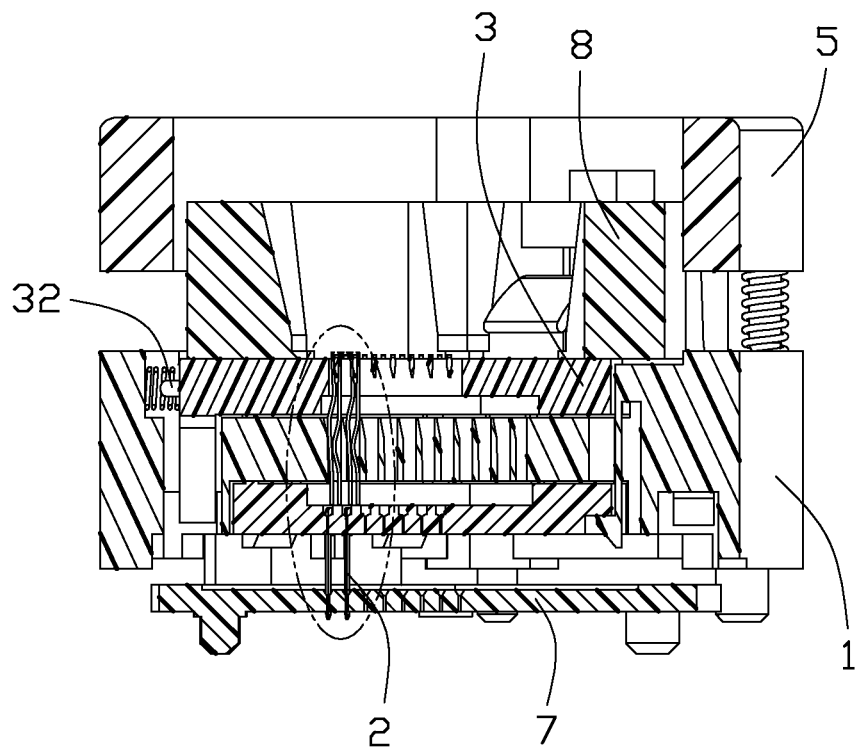
FIG. 7 is a cross-sectional view of the burn-in socket taken along lines 7-7 in FIG. 1, wherein the clamping arms are in an original statute.
Figure 8:
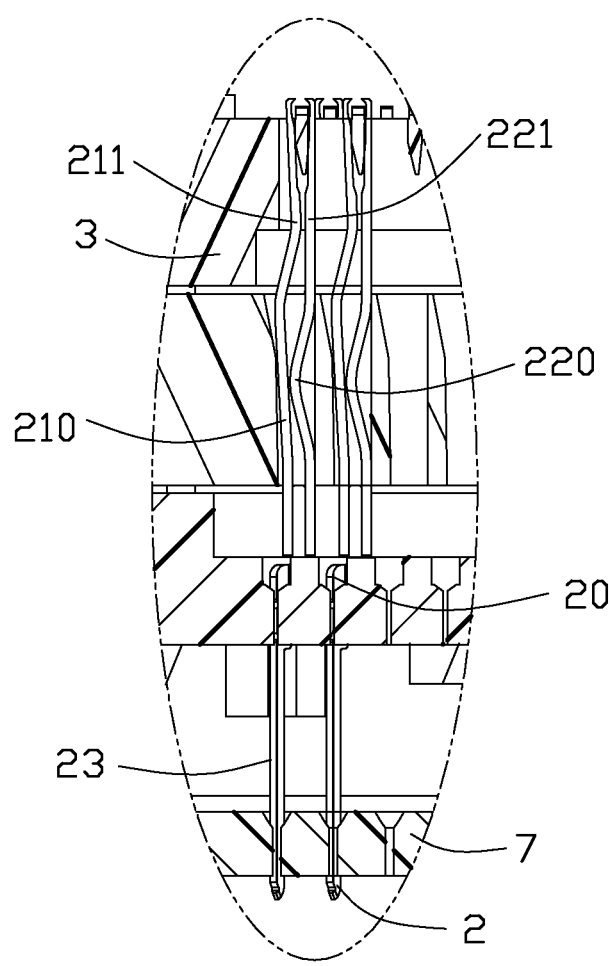
FIG. 8 is an enlarged view circled in FIG. 7.
Figure 9:
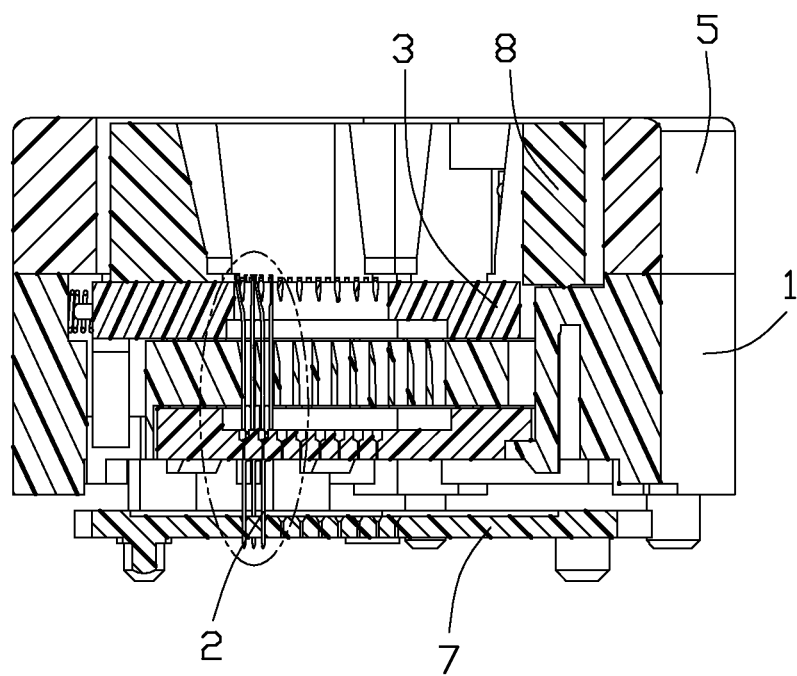
FIG. 9 is a cross-sectional view of the burn-in socket along lines 7-7 in FIG. 1, wherein the clamping arms are in an opening statute.
Figure 10:
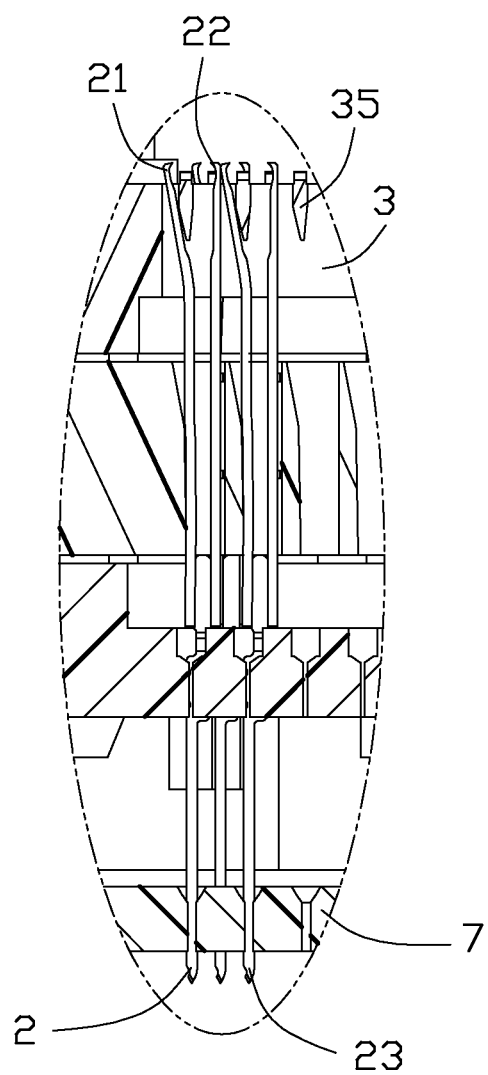
FIG. 10 is an enlarged view circled in FIG. 8.

Referring to FIGS. 7 and 8, the movable arm 21 and the static arm 22 is located at an original portion and a small distance may be existed therebetween. When the driven frame 5 is depressed to bring the sliding move in the diagonal direction, the movable arm 21 is forced by partitioning wall 35 of the sliding member 3 to move from the original position to an open position in which the gap between the clamping arm becomes larger, while the static arm 41 of the terminal 4 remains at its original state. The larger gap is ready for accommodate the solder ball of the IC package. When the driven frame 5 is released as shown in FIGS. 9 and 10, the burn-in socket is fitly retained in the receiving cavity 10 to establish an electrical connection between the IC package and the test socket.

However, the disclosure is illustrative only, changes may be made in detail, especially in matter of shape, size, and arrangement of parts within the principles of the invention.

What is claimed is:

1. A burn-in socket, for electrically connecting an integrated circuit (IC) package, comprising:
    an insulative seat with a plurality of terminal-retained passageways, each of the terminal-retained passageway defines two opposite inner sides;
    a sliding member receiving in insulative housing and defining a plurality of terminal-receiving passageways;
    a driven frame located on the sliding member and driving the sliding member moving relative to the insulative seat;
    a plurality of terminal retained in terminal-retained passageways of the insulative seat and received in the terminal-receiving passageways of the sliding member, each terminal comprising a base portion retained in the insulative seat, a board-connecting portion and a pair of clamping arms consisting of a movable arm and a static arm, the pair of clamping arms defining clamping ends at tips thereof; wherein
    the pair of clamping arms are located elastically against corresponding inner sides, the static arm defines a lower curved portion with a projecting tip and an upper linear portion, the projecting tip of the lower curved portion of the static arm elastically press against the movable arm permanently wherein the movably arm defines a lower linear portion and an upper curved portion with a projecting tip, the projecting tip of the upper curved portion of the movable arm temporarily presses against the upper linear portion of the static arm, thereby the clamping end of the movable arm moving far away from the static arm, wherein the lower linear portion of the movable arm and the lower curved portion of the static arm press against the inner sides of each terminal-retained passageway.

2. The burn-in socket as claimed in claim 1, wherein the upper linear portion of the static arm presses against the inner side of each terminal-retained passageway of the insulative seat.

3. The burn-in socket as claimed in claim 2, wherein the lower linear portion of the movable arm is disposed slantwise relative to the inner side of the terminal-retained passageway.

4. The burn-in socket as claimed in claim 3, wherein the projecting ends of the static arm and the movable arm overlap from a top view of the burn-in socket.

5. The burn-in socket as claimed in claim 4, wherein the terminal-receiving passageway defines a partitioning wall to accommodate with the two clamping arms respectively.

6. A burn-in socket comprising:
    a stationary insulative seat defining a plurality of terminal-retaining passageways, each of said terminal-retaining passageways extending in a vertical direction and spanning in a horizontal direction perpendicular to said vertical direction, each of said passageways defined between two neighboring dividing walls in said horizontal direction; and
    a sliding plate positioned upon the insulative seat and moveable along said horizontal direction, said sliding plate defining a plurality of terminal-receiving passageways corresponding to the corresponding terminal-retaining passageways in the vertical direction, respectively, each of said terminal-receiving passageways defined between two neighboring partition walls; and a plurality of terminals each including a fixed arm and a moveable arm commonly defining a pair of clamping arms, each of said fixed arm and said moveable arm defining a lower retaining section disposed in the corresponding terminal-retaining passageway and an upper contacting section disposed in the corresponding terminal receiving passageway; wherein for each terminal, the lower retaining section of said fixed arm and that of the moveable arm are both disposed in the same terminal retaining passageway directly confrontation with each other while an upper portion of the upper contacting section of the fixed arm is isolated, except a tip of the upper contacting section, from the moveable arm of the same terminal by the corresponding partition wall but directly confronting the moveable arm of the neighboring terminal in the same terminal-receiving passageway, wherein the sliding plate includes a plurality of upwardly curved ribs on an upper face in alignment with the corresponding partition walls, respectively, for holding a solder ball of an electronic package, wherein the sliding plate and the insulative seat are configured with latches for holding said sliding plate in position with regard to the insulative seat in the vertical direction while allowing said sliding plate to move in a diagonal direction in a top view.

7. The burn-in socket as claimed in claim 6, further including a positioning frame configured for receiving said electronic package therein, wherein said positioning frame defines latches for holding said sliding plate in position with regard to the insulative housing while allowing said positioning frame to move in said diagonal direction in the top view.

8. The burn-in socket as claimed in claim 6, wherein the fixed arm and the moveable arm contact with each other at an upper position in the corresponding terminal-receiving passageway and at a lower position in the corresponding terminal-retaining passageway, respectively.

9. The burn-in socket as claimed in claim 8, wherein the fixed arm abuts against the corresponding dividing wall at two spaced regions by two sides of said lower position.

10. The burn-in socket as claimed in claim 8, wherein said fixed arm and said moveable commonly define a diamond shape between said upper position and said lower position.

11. The burn-in socket as claimed in claim 6, wherein said sliding plate is moveable along a diagonal direction to bias the spring located at a corner thereof.

\* \* \* \* \*